(12) United States Patent
Chun et al.

(10) Patent No.: US 12,514,098 B2
(45) Date of Patent: Dec. 30, 2025

(54) LIGHT EMITTING DISPLAY DEVICE

(71) Applicant: LG DISPLAY CO., LTD., Seoul (KR)

(72) Inventors: Min Kyu Chun, Paju-si (KR); Jun Hee Han, Paju-si (KR)

(73) Assignee: LG Display Co., Ltd (KR)

( * ) Notice: Subject to any disclaimer, the term of this patent is extended or adjusted under 35 U.S.C. 154(b) by 522 days.

(21) Appl. No.: 17/976,769

(22) Filed: Oct. 29, 2022

(65) Prior Publication Data
US 2023/0217689 A1  Jul. 6, 2023

(30) Foreign Application Priority Data
Dec. 31, 2021 (KR) ........................ 10-2021-0194769

(51) Int. Cl.
*H01L 29/08* (2006.01)
*H10K 59/122* (2023.01)
*H10K 59/124* (2023.01)
*H10K 59/80* (2023.01)
*H10K 102/00* (2023.01)

(52) U.S. Cl.
CPC ......... *H10K 59/879* (2023.02); *H10K 59/122* (2023.02); *H10K 59/124* (2023.02); *H10K 2102/351* (2023.02)

(58) Field of Classification Search
CPC .. H10K 50/858; H10K 59/122; H10K 59/124; H10K 2102/351
USPC ......................................................... 257/40
See application file for complete search history.

(56) References Cited

U.S. PATENT DOCUMENTS

| | | | |
|---|---|---|---|
| 2016/0172422 A1* | 6/2016 | Kim | H10K 59/1213 438/34 |
| 2018/0166649 A1* | 6/2018 | Woo | H10K 59/80516 |
| 2018/0294428 A1* | 10/2018 | Nishimura | H10K 59/124 |

FOREIGN PATENT DOCUMENTS

| | | | | |
|---|---|---|---|---|
| DE | 102019121777 A1 * | 2/2020 | | H01L 27/3211 |
| KR | 20140014683 A | 2/2014 | | |
| KR | 10-2019-0128411 A | 11/2019 | | |
| KR | 10-2020-0133653 A | 11/2020 | | |

OTHER PUBLICATIONS

Cite the machine translation Jang J (DE-102019121777-A1).*
Korean Office Action dated Sep. 2, 2024 issued in Patent Application No. 10-2021-0194769 (7 pages).
Office Action in Korean Appln. No. 10-2021-0194769, mailed on May 2, 2025, 10 pages (with English translation).

* cited by examiner

*Primary Examiner* — Phuc T Dang
(74) *Attorney, Agent, or Firm* — Fish & Richardson P.C.

(57) ABSTRACT

A light emitting display device capable of vertically and horizontally adjusting an area where the energy of light is concentrated when laser light for repair is radiated, the adjusted area corresponds to an anode separation region, so that normal repair can be performed and damages on a cathode caused by energy concentration can be prevented by changing a structure under the cathode.

15 Claims, 14 Drawing Sheets

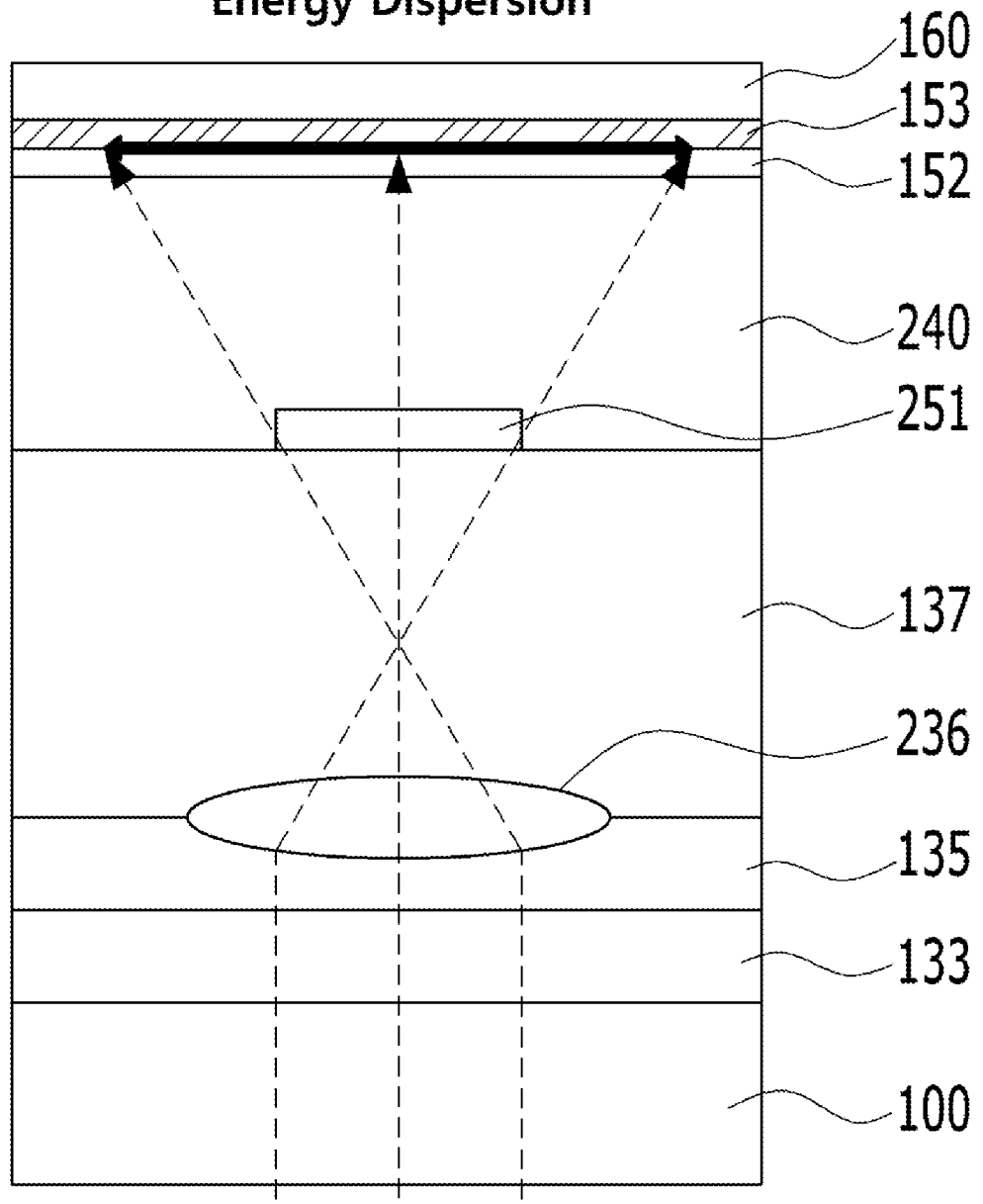

LIGHT EMITTING DISPLAY DEVICE

CROSS-REFERENCE TO RELATED APPLICATION

This application claims the priority of Korean Patent Application No. 10-2021-0194769, filed on Dec. 31, 2021, which is hereby incorporated by reference in its entirety.

BACKGROUND

Field of the Disclosure

The present disclosure relates to a display device, and particularly, to a light emitting display device capable of vertically and horizontally adjusting an area where the energy of light is concentrated when laser light for repair is radiated to achieve normal repair and preventing a cathode from being damaged by energy concentration by changing a structure under the cathode.

Description of the Background

With the advent of the information age, displays for visually representing electrical information signals has developed rapidly, and various thin and lightweight display devices having low power consumption and high performance have been developed and are rapidly replacing the existing cathode ray tubes (CRTs).

Thereamong, a light emitting display device that does not require a separate light source, does not have a separate light source for a compact device and clear color display, and includes light emitting elements in a display panel is considered as a competitive application.

Meanwhile, light emitting display devices are subjected to inspection before being released, and when a defective sub-pixel having a bright or dark spot is detected in the inspection step, repair is performed to separate a light emitting part of the defective sub-pixel from a driving circuit.

SUMMARY

Accordingly, the present disclosure is to provide a light emitting display device capable of vertically and horizontally adjusting an area where the energy of light is concentrated when laser light for repair is radiated to achieve normal repair and preventing a cathode from being damaged by energy concentration by changing structure under the cathode.

The present disclosure includes a control unit capable of adjusting an incident area of light in a non-emission part. Accordingly, the present disclosure prevents cathode from being damaged by radiated light during repair to achieve normal repair and improving device reliability.

In an aspect of the present disclosure, a light emitting display device includes a substrate including a plurality of sub-pixels, each sub-pixel having an emission part and a non-emission part, a lens at a part of the non-emission part on the substrate, a planarization layer covering the lens and provided on the plurality of sub-pixels, an anode overlapping with the emission part and the lens at each of the sub-pixels, on the planarization layer and, a cap electrode pattern provided on the anode and overlapping with the lens, and an organic layer and a cathode sequentially disposed on the anode.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings:

FIGS. 6A and 6B are diagrams showing energy transfer states when a lens is provided in a laser irradiation region when a lens is not provided therein;

DETAILED DESCRIPTION

Figure 1:
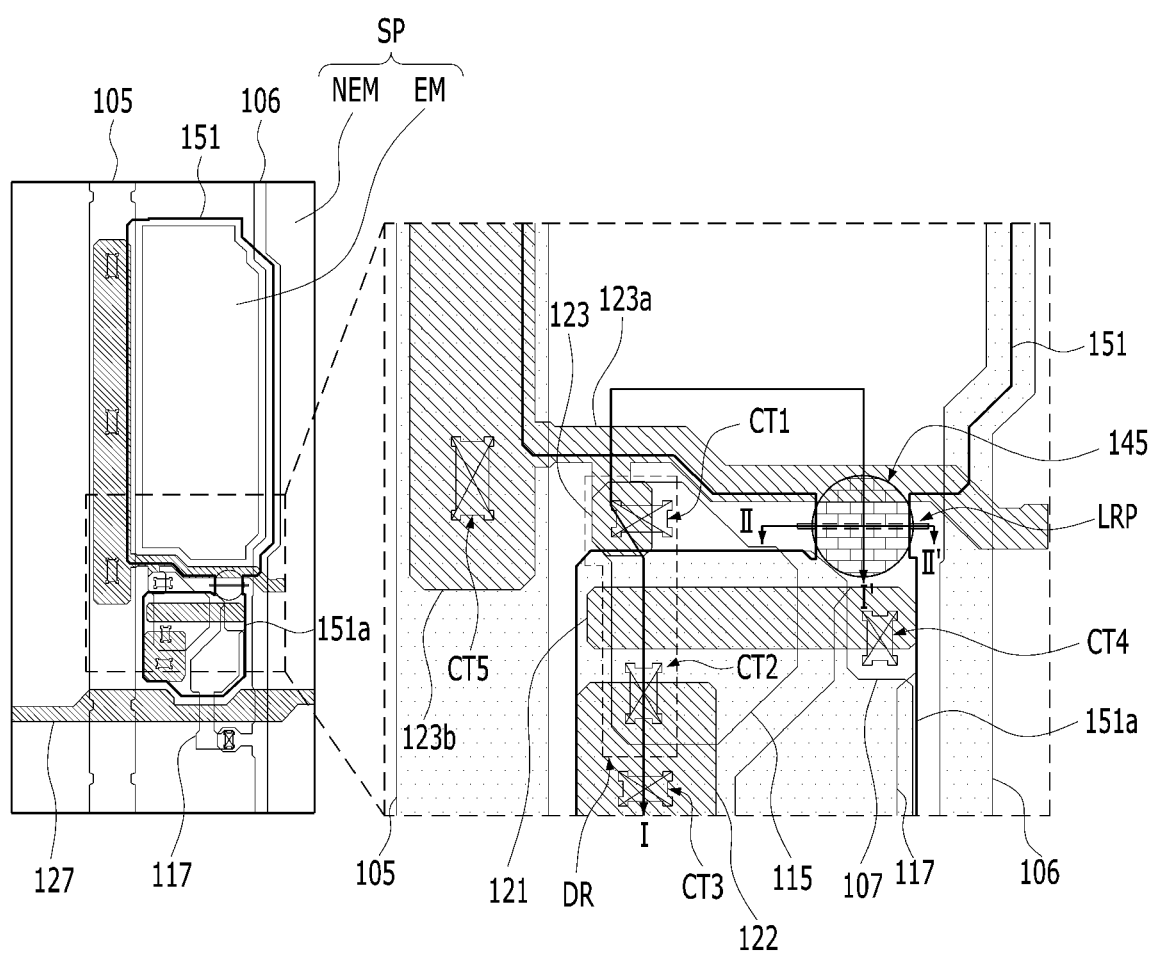
FIG. 1 is a plan view showing a light emitting display device of the present disclosure.

Hereinafter, various aspects of the present disclosure will be described with reference to the attached drawings. The same reference numbers will be used throughout this specification to refer to the same or like parts. In the following description of the present disclosure, a detailed description of known functions and configurations incorporated herein will be omitted when it may obscure the subject matter of the present disclosure.

In the drawings for explaining the exemplary aspects of the present disclosure, for example, the illustrated shape, size, ratio, angle, and number are given by way of example, and thus, are not limited to the disclosure of the present disclosure. Throughout the present specification, the same reference numerals designate the same constituent elements. In addition, in the following description of the present disclosure, a detailed description of known functions and configurations incorporated herein will be omitted when it may make the subject matter of the present disclosure rather unclear. The terms "comprises", "includes" and/or "has", used in this specification, do not preclude the presence or addition of other elements unless it is used along with the term "only". The singular forms are intended to include the plural forms as well unless the context clearly indicates otherwise.

In interpreting a component, it is interpreted as including an error range even if there is no separate explicit description.

When describing positional relationships, for example, when the positional relationship between two parts is described using "on", "above", "below", "aside", or the like, one or more other parts may be located between the two parts unless the term "directly" or "closely" is used.

In the description of the various aspects of the present disclosure, when describing temporal relationships, for example, when the temporal relationship between two actions is described using "after", "subsequently", "next", "before", or the like, the actions may not occur in succession unless the term "directly" or "just" is used.

In the following description of the aspects, "first" and "second" are used to describe various components, but such components are not limited by these terms. The terms are used to discriminate one component from another component. Accordingly, a first component mentioned in the following description may be a second component within the technical spirit of the present disclosure.

The respective features of the various aspects of the present disclosure may be partially or wholly coupled to and combined with each other, and various technical linkage and driving thereof are possible. These various aspects may be performed independently of each other, or may be performed in association with each other.

In a light emitting display device, when an anode is formed as a transparent electrode and a cathode is formed of a metal, laser light is radiated from the lower side of a substrate to the anode in a predetermined sub-pixel in which a defect is observed to remove a portion of the anode to which the laser light is radiated. By doing so, the anode on a light emitting part and an anode extension part connected to a driving circuit are separated.

However, since the anode is a transparent electrode, the laser light directed to the anode from the bottom passes through the anode instead of converging on the anode and is concentrated on the cathode, and thus unintentional or undesired cracks or open regions occur in a region of the cathode which is irradiated with the laser light. In this case, oxygen or moisture may permeate into an organic layer under the cathode through cracks or open regions, which may cause a problem that the lifespan of the light emitting element is reduced.

A light emitting display device of the present disclosure is designed to solve a defect caused by damage to a cathode by laser irradiation, and has the following configuration.

Figure 2:
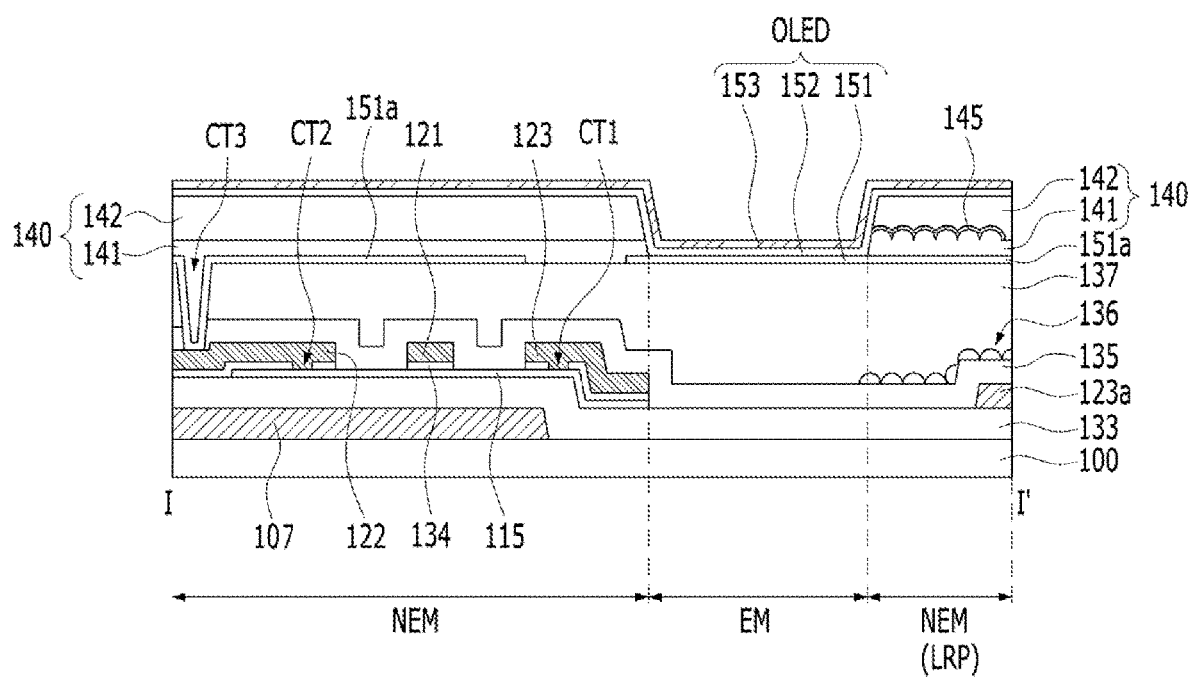
FIG. 2 is a cross-sectional view taken along line I-I' of FIG. 1.
Figure 3:
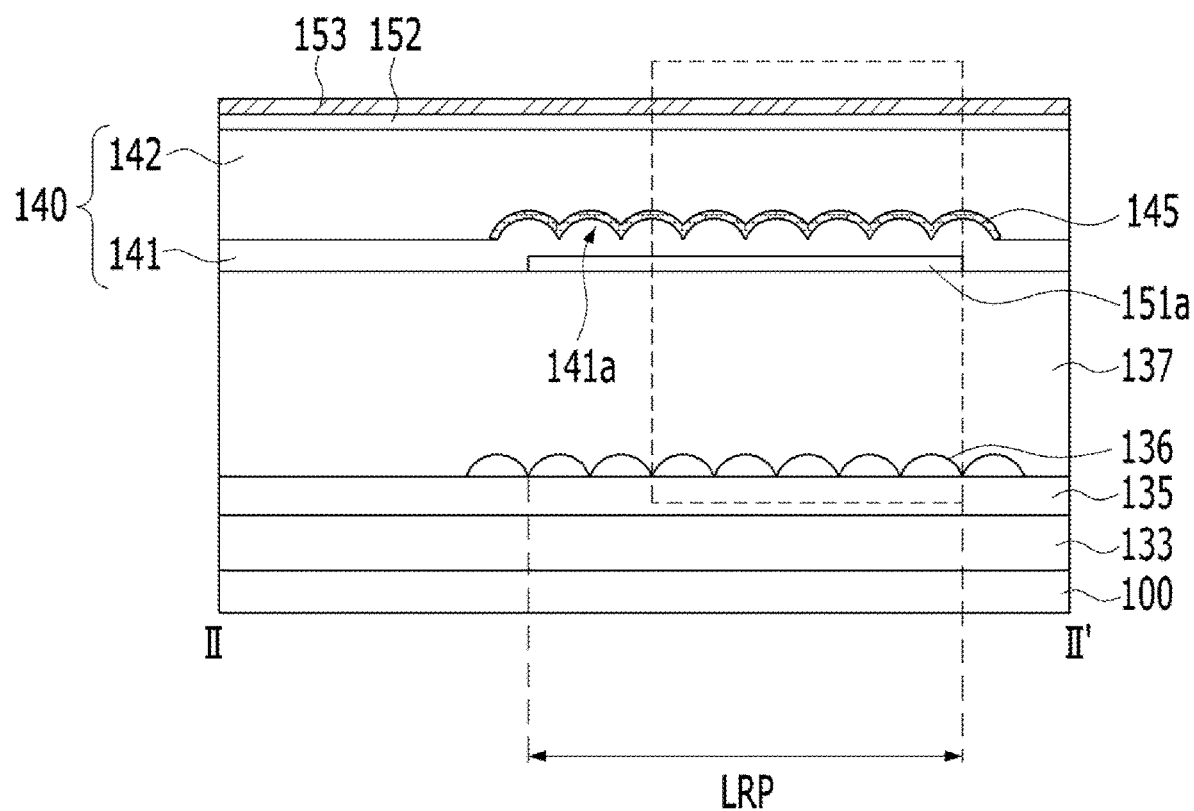
FIG. 3 is a cross-sectional view taken along line II-II' of FIG. 1.
Figure 4:
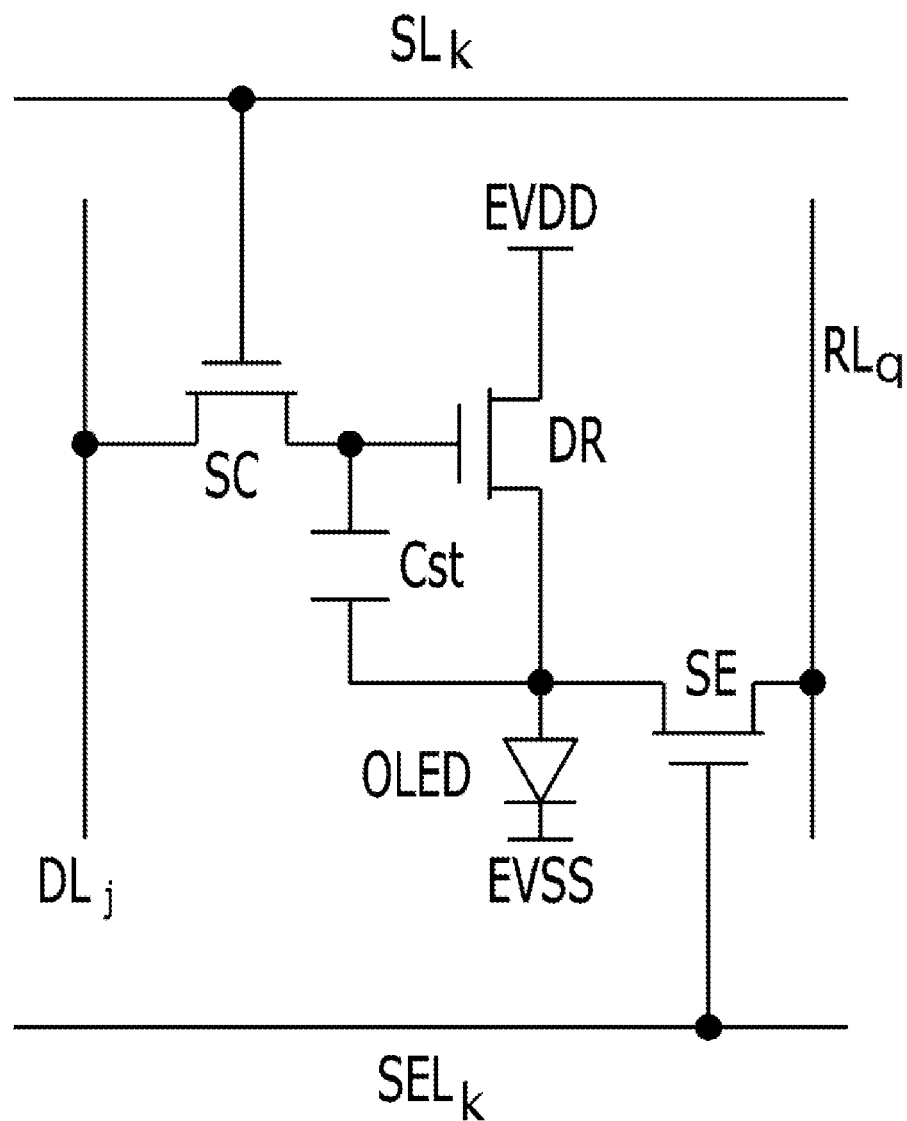
FIG. 4 is a circuit diagram of one sub-pixel of the light emitting display device of the present disclosure.

FIG. 1 is a plan view showing the light emitting display device according to the present disclosure, and FIG. 2 is a cross-sectional view taken along line I-I' of FIG. 1. FIG. 3 is a cross-sectional view taken along line II-IF of FIG. 2 and FIG. 4 is a circuit diagram of one sub-pixel of the light emitting display device of the present disclosure.

As shown in FIGS. 1 to 3, the light emitting display device according to an aspect of the present disclosure includes a substrate 100 including a plurality of sub-pixels SP, a lens 136 provided on a portion of a non-emission part NEM of the substrate 100, a planarization layer 137 covering the lens 136 and provided on the plurality of sub-pixels of the substrate 100, and a light emitting element OLED composed of an anode 151 provided in each sub-pixel, an organic layer 152 including an emission layer, and a cathode 153.

Here, each sub-pixel SP includes an emission part EM that emits light when each light emitting element is turned on, and a non-emission part NEM that is covered by a bank 140 around the emission part and includes a driving circuit. The bank 140 has an open area for the emission part EM.

In the light emitting display device of the present disclosure, the anode 151 is provided on the entire emission part EM and includes an anode extension part 151a integrated with the anode 151 and extended to the non-emission part NEM. The anode extension part 151a is connected to a source electrode 122 of a driving transistor DR to receive an electrical signal, and the same signal is also applied to the integrated anode 151. The anode extension part 151a is integrated with the anode 151, and since the same signal is applied to the anode 151 and the anode extension part 151a in a normal state, the anode extension part 151a may be regarded as a component included in the anode.

A part of the anode extension part 151a located in the non-emission part NEM may become a laser irradiation region LRP during repair. When laser irradiation is normally performed for the laser irradiation region LRP, the driving circuit connected to the anode 151 or the anode extension part 151a in a sub-pixel is electrically separated from the anode 151 of the emission part on the basis of the laser irradiation region LRP. The laser irradiation region LRP is defined as a region having a narrow width outside of the emission part EM as shown in FIG. 1 for facilitating laser radiation, and both sides of the laser irradiation region LRP can be separated from each other by local laser irradiation. In addition, in the laser irradiation region LRP, a metal pattern is not provided between the substrate 100 and the anode extension part 151a and thus laser light radiated from the bottom of the substrate 100 can converge on the anode extension part 151a. The laser irradiation region LRP approximately corresponds an area between the emission part EM and a region where the anode extension part 151a and the driving circuit in the sub-pixel are connected in the non-emission part NEM. Further, when the anode extension part 151a normally has a cut portion after a laser is radiated to the laser irradiation region LRP, the anode 151 provided on the entire emission part EM is separated from the anode extension part 151a connected to the driving circuit, for example, the driving transistor DR. Accordingly, after the anode extension part 151a is cut, the anode extension part 151a is electrically separated from the anode 151 on the emission part EM, and the anode 151 on the emission part EM does not receive an electrical signal in a floating state. Therefore, when the anode 151 has been normally separated from the anode extension part 151a after laser is radiated to the laser irradiation region LRP, the emission part EM of the corresponding sub-pixel is darkened and thus a defect is not visually recognized therein.

The anode 151 and the anode extension part 151a are transparent electrodes formed of Indium Tin Oxide (ITO), Indium Zinc Oxide (IZO), Indium Tin Zinc Oxide (ITZO), or the like and thus transmit most of light when straight light enters from the bottom. However, in the light emitting display device of the present disclosure, the lens 136 is provided under the anode extension part 151a and a cap electrode pattern 145 is provided on the anode extension part 151a in the laser irradiation region LRP such that laser light finally converges on the anode extension part 151a corresponding to the laser irradiation region LRP. To this end, the lens 136 and the cap electrode pattern 145 are disposed at a portion overlapping with the laser irradiation region LRP.

In addition, the laser irradiation region LRP is provided for all pixels, but laser is substantially radiated to the laser irradiation region LRP corresponding to only sub-pixels determined to be defective in a sub-pixel defect inspection process. Although normal sub-pixels have the laser irradiation region LRP, the anode extension part 151a is not structurally separated because laser is not radiated thereto. In this case, the laser irradiation region LRP of the normal sub-pixels corresponds to the lens 136 and the cap electrode pattern 145 having the anode extension part 151a interposed therebetween.

The lens 136 corresponds to the laser irradiation region LRP, has an upper surface with a plurality of curved portions, and is made of a high refractive index material. The refractive index of the material of the lens 136 is approximately 1.6 or more, which is higher than that of the planarization layer 137 disposed on the lens 136. Accordingly, straight incident light from the bottom of the substrate 100 is refracted while passing through the lens 136. In addition, in order to increase the refractive effect, the refractive index of the material of the lens 136 is greater than the refractive index of the planarization layer 137. In some cases, the lens 136 may be formed of, for example, a transparent metal oxide film such as TiO2, and the planarization layer 137 may be formed of a low refractive index material such as photoacryl.

The lens 136 is positioned on a passivation film 135 for protecting the driving circuit and is selectively formed in a hemispherical or arc shape in cross-section on the surface of the passivation film 135.

The lens 136 has the effect of refracting and dispersing straight light. By using a phenomenon in which the intensity of light is inversely proportional to the square of the distance, laser light incident from the bottom of the substrate is reflected while passing through the lens 136, and thus the optical distance to the cathode 153 increases, reducing the amount of light transmitted to the cathode 153. Accordingly, the laser light does not arrive at the cathode 153 as straight light and thus the cathode 153 can be prevented from being locally damaged by the laser light.

The lens 136 and the cap electrode pattern 145 are provided to correspond to each other in the laser irradiation region LRP, thereby enhancing the effect of convergence of laser light on the anode extension part 151a.

The cap electrode pattern 145 is made of a reflective metal or a reflective metal alloy and has a property of reflecting light when the light is incident on the surface thereof. Accordingly, it is possible to prevent the laser light incident on the cap electrode pattern 145 from being transmitted upward and affecting the cathode 153.

The cap electrode pattern 145 may be formed of any one of silver (Ag), aluminum (Al), gold (Au), magnesium, strontium (Sr), and molybdenum (Mo), or a reflective alloy including at least one of the aforementioned metals. When the cap electrode pattern 145 is formed of a reflective alloy, it may further include the aforementioned metals and other metals that are not mentioned above or are non-reflective. Accordingly, the cap electrode pattern 145 covers the anode extension part 151a in the laser irradiation region LRP such that laser light radiated thereto is reflected downward from the inner surface of the cap electrode pattern 145. As a result, the cap electrode pattern 145 prevents the laser light from passing through the cap electrode pattern 145 or reduces the amount of light to prevent the cathode 153 from being damaged.

The cap electrode pattern 145 is provided inside the bank 140 and is thin. The cap electrode pattern 145 has a thickness of 1 nm to 1 μm and is thinner than the bank 140. If the cap electrode pattern 145 has a thickness of 300 nm or less, the cap electrode pattern 145 can transmit some light even if it includes a reflective metal. However, even in this case, it is possible to prevent light from arriving at the cathode 153 and damaging the cathode 153 by adjusting an optical distance and a region on which light converges combination with the lens 136 in the light emitting display device of the present disclosure.

In addition, the cap electrode pattern 145 is provided in a very localized area corresponding to the non-emission part NEM, particularly, the laser irradiation region LRP in a plan view, and thus does not affect the luminous efficacy of the emission part and protects the cathode 153 from laser light to improve the reliability of the light emitting display device.

The bank 140 may include a first bank 141 and a second bank 142, and the cap electrode pattern 145 may be provided between the first and second banks 141 and 142. That is, the first bank 141 may be positioned between the anode extension part 151a and the cap electrode pattern 145, and the second bank 142 may be positioned between the cap electrode pattern 145 and the cathode 153 in the laser irradiation region LRP.

In addition, as shown in FIGS. 2 and 3, the cap electrode pattern 145 has one or more curved portions, and thus light reflected from the inner surface thereof does not directly reach the substrate 100 and the amount of light converging on the anode extension part 151a increases.

As shown in FIG. 3, the cap electrode pattern 145 is provided such that the curved portions thereof face the upper surface 141a of the first bank 141, and the upper surface 141a of the first bank 141 may have curved portions corresponding to the curved portions of the cap electrode pattern 145. This increases the refractive effect when light is reflected from the inner surface of the cap electrode pattern 145.

As shown FIGS. 2 and 3, the first and second banks 141 and 142 may come into contact with each other in the non-emission part NEM in which the cap electrode pattern 145 is not provided. In addition, in the non-emission part NEM except for the laser irradiation region LRP, the interface between the first and second banks 141 and 142 in contact with each other may be flat.

The non-emission part NEM includes a sub-pixel driving circuit, the sub-pixel driving circuit is protected by the passivation film 135, and the lens 136 may be provided on the passivation film 135 of the non-emission part NEM. In some cases, the lens 136 may be formed integrally with the passivation film 135. The lens 136 may have curved portions through a process of forming a film of a high refractive index material and then performing reflow at least in the laser irradiation region LRP. Accordingly, the lens 136 can increase the refraction effect on the surface thereof such that a light path is dispersed even when light passing through the anode extension part 151a is transmitted to the cathode 153, thereby preventing the energy of light from concentrating on a predetermined portion of the cathode 153.

In addition, the pixel driver in the sub-pixel SP may include a plurality of transistors for driving, and may include a switching transistor SC turned on by a scan signal applied through a scan line SLk to receive a data voltage of a signal line, and a driving transistor DR connected to the switching transistor SC to supply a driving current to the light emitting element OLED through a first power voltage line connected thereto according to a turn-on operation of the switching transistor SC as basic components. A specific example of the pixel driver will be described with reference to FIG. 4. The transistors in the sub-pixel SP may have the same stack structure having the same active layer, or may have a heterogeneous stack structure in which active layers are formed on different layers.

The organic layer 152 may be formed over the entire display area of the substrate 100 or may be provided in the form of an island in the emission part EM of each sub-pixel. The organic layer 152 may include a hole injection layer for injecting holes from the anode 151, a hole transport layer for transferring holes from the hole injection layer to the emission layer, an electron transport layer for transferring electrons to the emission layer, and an electron injection layer for injecting electrons into the electron transport layer from the cathode 153 in addition to the emission layer. When the organic layer 152 has a plurality of layers, only the emission layer is selectively formed for each sub-pixel, and the hole injection layer, hole transport layer, electron transport layer, and electron injection layer may be formed integrally over the entire display area including the plurality of sub-pixels instead of being divided for the sub-pixels. The cathode 153 may also be integrally formed in the display area without being divided for respective sub-pixels. The extent to which the organic layer 152 and the cathode 153 extend from the edge of the display area including the sub-pixels may vary as necessary. The cathode 153 may be electrically connected to a second power voltage line disposed therebelow outside the display area. A ground voltage or a low power voltage may be applied to the cathode 153 through the second power voltage line.

The light emitting element OLED is connected to the driving transistor DR through the anode extension part 151a in the non-emission part NEM.

The driving transistor DR includes a first semiconductor layer 115, a driving gate electrode 121 overlapping with a channel region of the first semiconductor layer 115 with a gate insulating layer 134 interposed therebetween, and a driving drain electrode 123 and a driving source electrode 122 connected to both sides of the semiconductor layer 115 through first and second contact holes CT1 and CT2, respectively.

As illustrated, the driving gate electrode 121, the driving drain electrode 123, and the driving source electrode 122 may be provided on the same layer, or the driving gate electrode 121 may be provided on a layer different from the driving source electrode 122 and the driving drain electrode 123.

The first semiconductor layer 115 may be made of a transparent oxide including at least two of indium, gallium, zinc, and tin, and in some cases, may be made of amorphous silicon, crystalline silicon, or other semiconductor materials. In some cases, the semiconductor layer may include two or more semiconductor layers having different physical properties. FIG. 2 shows an example in which a lower light blocking metal 107 is further provided at least under the channel of the first semiconductor layer 115. The lower light blocking metal 107 prevents light incident from the bottom of the substrate 100 from entering the channel of the first semiconductor layer 115 to solve problems such as generation of photocurrent. The semiconductor layer is provided in the switching transistor SC or other transistors in addition to the above-described driving transistor DR, and in this case, the semiconductor layer may be formed on the same layer. In this case, the lower light blocking metal 107 may be extended and provided under a second semiconductor layer 117 spaced apart from the first semiconductor 115 in addition to the first semiconductor layer 115.

Meanwhile, a first power voltage line 105 and a data line 106 may be further provided on the same layer as the lower light blocking metal 107.

In addition, the first power voltage line 105 may be connected to a horizontal extension line 123a integrated with another layer, for example, the driving drain electrode 123, and a vertical line 123b integrated with the horizontal extension line 123a and overlapping with the first power voltage line 105 through a fifth contact hole CT5 to be shared by neighboring sub-pixels.

Only the scan line 127 intersecting the first power voltage line 105 and the data line 106 is illustrated in FIG. 1, and other transistors such as the switching transistor are omitted.

Since the driving gate electrode 121 of the driving transistor DR may be connected to the switching source electrode or the switching drain electrode of the switching transistor, the second semiconductor layer 117 included in the switching transistor may be connected to the driving gate electrode 121 through a fourth contact hole CT4.

The driving source electrode 122 may be connected to the anode extension part 151a through a third contact hole CT3. The third contact hole CT3 is provided to correspond to a portion of the upper surface of the driving source electrode 122 exposed by selectively removing the passivation film 135 and the planarization layer 137.

An interlayer insulating layer 133 is provided between the layers of the lower light blocking metal 107, the first power voltage line 105, and the data line 106 and the first and second semiconductor layers 115 and 117.

The first and second banks 141 and 142 may be made of the same material, and only a portion of the first bank 141 corresponding to the laser irradiation region LRP of the non-emission part NEM has curved portions corresponding to the cap electrode pattern 145 having the curved portions formed on the first bank 141. The cap electrode pattern 145 is disposed inside the bank 140 and is thinner than the second bank 142. As illustrated, the thickness of the cap electrode pattern 145 may be less than the height of the curved portions of the upper surface 141a of the first bank. However, the present disclosure is not limited thereto, and the thickness of the cap electrode pattern 145 may correspond to or be thicker than the curved portions of the upper surface 141a of the first bank while being thinner than the second bank 142. However, even when the cap electrode pattern 145 is thick as described above, the cap electrode pattern 145 can reflect radiated laser light from the curved portions in contact with the curved portions of the first bank 141, and thus the amount of light transmitted to the anode extension part 151a can be increased. Further, little or no light is transmitted upward, and thus the cathode 153 can be prevented from being damaged by the radiated laser light.

Meanwhile, as shown in FIG. 4, each sub-pixel may further include a storage capacitor Cst capable of storing a difference voltage between the gate electrode and the source electrode of the driving transistor DR to stabilize characteristics of the pixel driver during operation of the light emitting element OLED.

The light emitting element OLED emits light according to a current supplied through the driving transistor DR. The anode 151 of the light emitting element OLED and the anode extension part 151a integrated with the anode may be connected to the source electrode (122 in FIG. 1) of the driving transistor DR, and the cathode 153 may be connected to the second power voltage line through which the low power voltage EVSS is supplied outside the display area of the substrate 100.

In the light emitting element OLED, when a voltage is applied to the anode 151 and the cathode 153, holes and electrons move to the emission layer through the hole transport layer and the electron transport layer and are combined in the emission layer to emit light.

The driving transistor DR is disposed between the first power voltage line 105 through which the driving power voltage EVDD is supplied and the light emitting element OLED. The driving transistor DR adjusts a current flowing from the first power voltage line 105 to the light emitting element OLED according to a voltage difference between the driving gate electrode and the driving source electrode. The driving gate electrode 121 of the driving transistor DR may be connected to the switching source electrode of the switching transistor SC, the driving drain electrode 123 may be connected to the first power voltage line 105 to be provided with the driving power voltage EVDD, and the driving source electrode 122 may be connected to the anode extension part 151a integrated with the anode 151 of the light emitting element OLED.

The switching transistor SC is turned on by a k-th scan signal of a k-th scan line SLk to supply a voltage of a j-th signal line DLj to the gate electrode of the driving transistor DR. The gate electrode of the switching transistor SC may be connected to the k-th scan line SLk, the source electrode may be connected to the gate electrode of the driving transistor DR, and the drain electrode may be connected to the j-th signal line DLj.

A sensing transistor SE is turned on by a k-th initialization signal of a k-th sense line SELk to connect a q-th reference voltage line RLq to the source electrode of the driving transistor DR. The gate electrode of the sensing transistor SE may be connected to the k-th sense line SELk, the drain electrode may be connected to the q-th reference voltage line RLq, and the source electrode may be connected to the drain electrode of the driving transistor DR.

The storage capacitor Cst stores a difference voltage between the gate voltage and the source voltage of the driving transistor DR.

One electrode of the storage capacitor Cst may be connected to the gate electrode of the driving transistor DR and the source electrode of the switching transistor SC, and the other electrode may be connected to the source electrode of the driving transistor DR, the source electrode of the sensing transistor SE, and the anode 151 or the anode extension part 151a of the light emitting element OLED.

Although an example in which the driving transistor DR, the switching transistor SC, and the sensing transistor SE of each sub-pixel SP are N-type semiconductor transistors having N-type semiconductor characteristics is shown in FIG. 4, aspects of the present specification are not limited thereto. That is, the driving transistor DR, the switching transistor SC, and the sensing transistor SE of each sub-pixel SP may be P-type semiconductor transistors having P-type semiconductor characteristics.

In some cases, the source electrode and the drain electrode of the driving transistor DR, the sensing transistor SE, and the switching transistor SC may be opposite to the aforementioned example.

Further, although FIG. 4 illustrates a case in which three transistors and one storage capacitor are included in the sub-pixel, the light emitting display device of the present disclosure is not limited thereto, and the number of transistors may be increased or decreased and the number of storage capacitors may be increased.

The principle of the light emitting display device of the present disclosure will be described with reference to the drawings.

Figure 5:
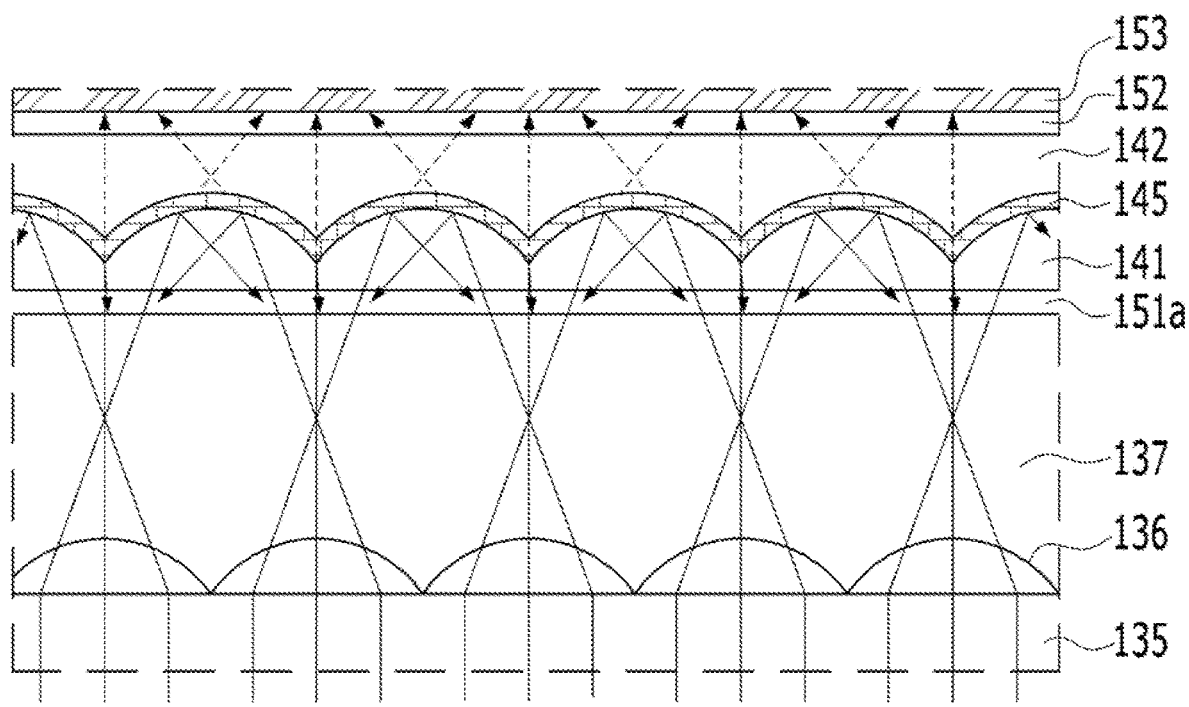
FIG. 5 is a diagram showing the progress of light during radiation of laser light in a laser irradiation region of FIG. 3.
Figure 6A:
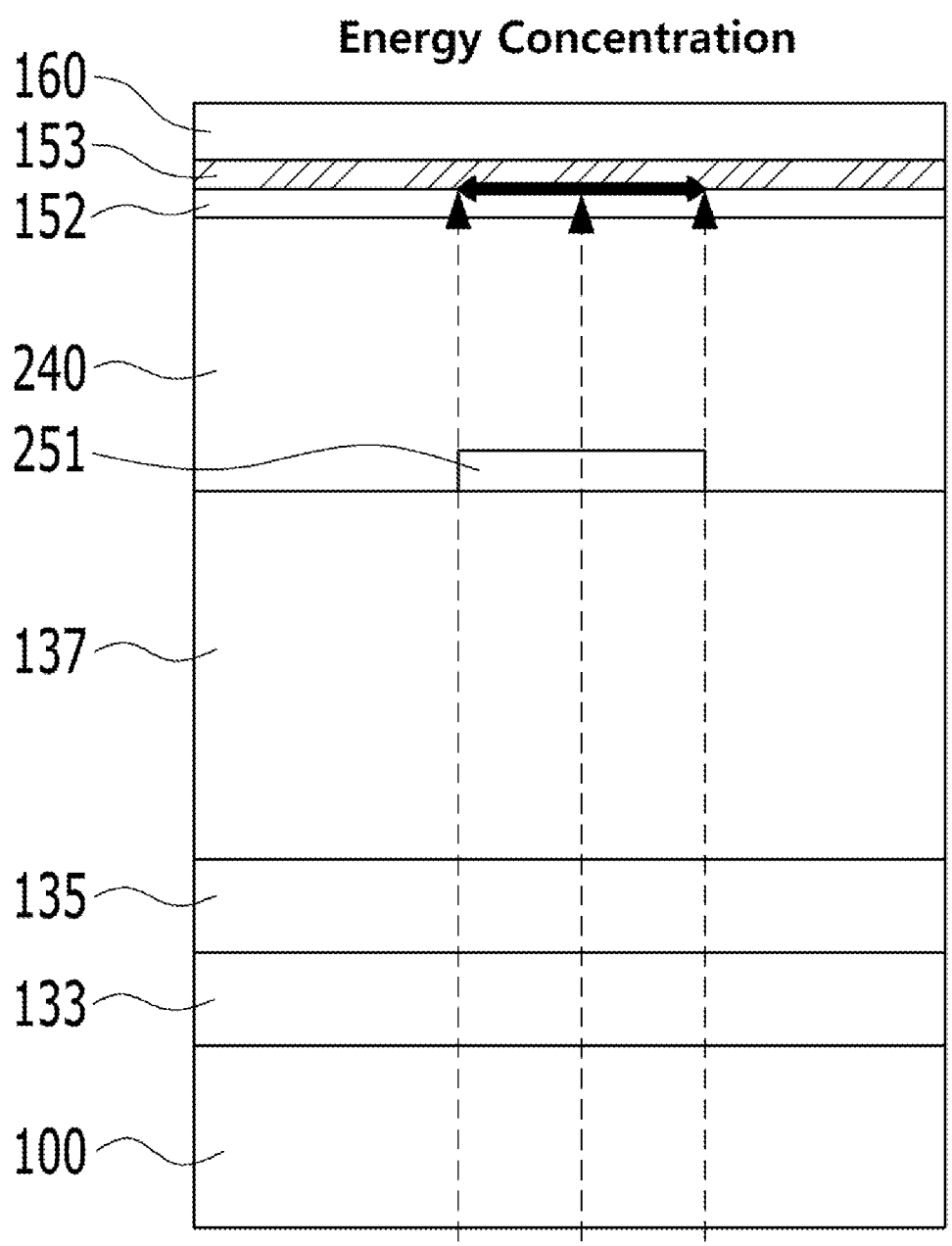
Figure 7:
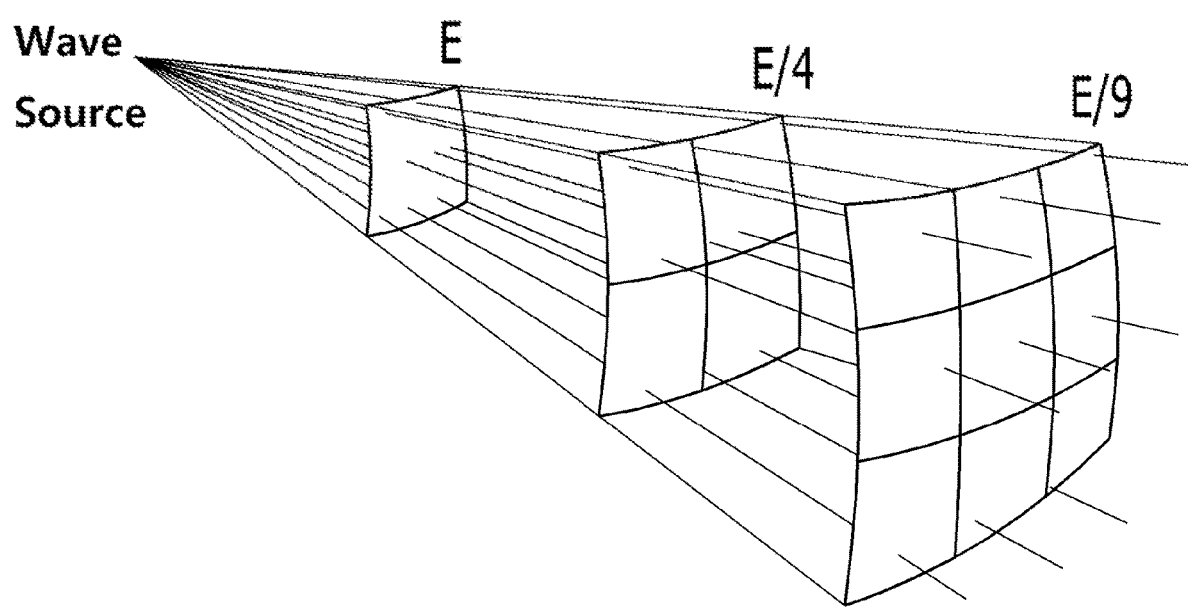
FIG. 7 is a diagram showing areas at which light arrives at predetermined distances from a light source and amounts of light energy according to the areas.

FIG. 5 is a diagram showing the progress of light during radiation of laser light to the laser irradiation region of FIG. 3, FIGS. 6A and 6B are diagrams showing energy transfer states when the lens is provided in the laser irradiation region and when the lens is not provided therein. FIG. 7 is a diagram showing areas at which light arrives at predetermined distances from a light source and amounts of light energy according to the areas.

As shown in FIG. 5, the progress of laser light in the laser irradiation region LRP is as follows.

The laser light is incident on a local area of the substrate 100 from a light source in the form of straight light. That is, straight light from a laser light source located below the laser irradiation region LRP of the substrate (refer to 100 of FIG. 3) passes through the interlayer insulating film (refer to 133 of FIG. 3) and the passivation film 135, refracted at the lens 136, is focused in the planarization layer 137. This refracted light continuously passes through the anode extension part 151a and the first bank 141 in a refracted state, and is reflected from the inner surface of the cap electrode pattern 145 to travel downwards. Since the cap electrode pattern 145 has the curved portions in the laser irradiation region (laser radiation part) LRP, the laser light is reflected in a refracted state from the inner surface of the cap electrode pattern 145. Here, the amount of converging laser light increases in the anode extension part 151a because the laser light passes through the anode extension part 151a twice when the refracted light travels from the bottom to the top and when the refracted light travels from the top to the bottom after being reflected from the cap electrode pattern 145. Although the anode extension part 151a is a transparent electrode disposed between the lens 136 and the cap electrode pattern 145 including a reflective electrode, it contains metal components such as indium and tin and thus may be damaged by local concentration of energy due to the converging laser light. The remaining components between the lens 136 and the cap electrode pattern 145 are the planarization layer 137 and the first bank 141, which are made of an organic insulating material, so that light passes in the traveling direction but neither is concentrated nor converges therein and thus does not affect the planarization layer 137 and the first bank 141.

When the cap electrode pattern 145 has a thickness of 300 nm or less, even if the cap electrode pattern 145 includes a reflective metal, some of light may pass through the cap electrode pattern 145. However, the amount of light passing through the cap electrode pattern 145 is 10% or less of the amount of light passing between the lens 136 and the inner surface of the cap electrode pattern 145, and thus light propagating (or traveling) upwards from the cap electrode pattern 145 does not affect the cathode 153.

In addition, when the cap electrode pattern 145 is thin, the outer surface of the cap electrode pattern 145 has curved portions similarly to the inner surface, and thus light transmitted from the outer surface of the cap electrode pattern 145 is refracted and diffused. Since the amount of light at a predetermined distance from the light source is inversely proportional to the square of the area through which the light passes, the amount of light decreases if a degree of diffusion increases, and thus the influence on the cap electrode pattern 145 is insignificant.

FIG. 6A shows a structure in which the aforementioned lens and cap electrode pattern are not provided and corresponds to a first experimental example Ex1. When laser light is radiated from the bottom of the substrate 100 to an anode extension part 251, the laser light passes through the transparent anode extension part 251 in the form of straight light and is transmitted to the cathode 153. Here, the energy of the straight laser light strong enough to burn a metal is concentrated on a local area and thus may damage the cathode 153.

FIG. 6B shows an example in which a lens 236 is provided under the anode extension part 251 and corresponds to a second experimental example Ex2. In this case, the lens 236 takes the form of a convex lens with both surfaces convex, and straight laser light incident from the bottom of the substrate 100 refracts at the lens 236. In the second experimental example Ex2, the refracted light passes through the anode extension part 251 and is transmitted to the cathode 153 in a refracted state. Here, since the projection area of the light is relatively wider than that of the first experimental example Ex1, the amount of light is reduced as compared to the first experimental example Ex1 due to the characteristic that the amount of light E at a predetermined distance from a light source is inversely proportional to the square of the area occupied by a region to which the light is projected, as shown in FIG. 7. This indicates the significance of including the lens in the light emitting display device of the present disclosure.

Meanwhile, in the light emitting display device of the present disclosure, the lens 136 having a curvature only on the upper surface is formed on the flat passivation film 135 as shown in FIG. 5. This is for the convenience of the process. That is, after completion of formation of the passivation film 135, a highly refractive material is left in the laser irradiation region LRP and then reflowed to form curved portions. Accordingly, straight laser light equally is refracted at the lens 236 with both surfaces convex in FIG. 6B and the above-described lens 136 of FIG. 5 when traveling upward. Accordingly, the projection area of the light arriving at the cathode 153 is widened, and thus the amount of light in the cathode 153 can be decreased and the cathode 153 can be prevented from being damaged.

Meanwhile, reference numeral 160 which is not described in FIGS. 6A and 6B represents a capping layer or an encapsulation layer for protecting the cathode 153. The capping layer or the encapsulation layer may also be formed on the cathode 153 of the light emitting display device of the present disclosure described with reference to FIGS. 1 to 4.

Figure 8A:
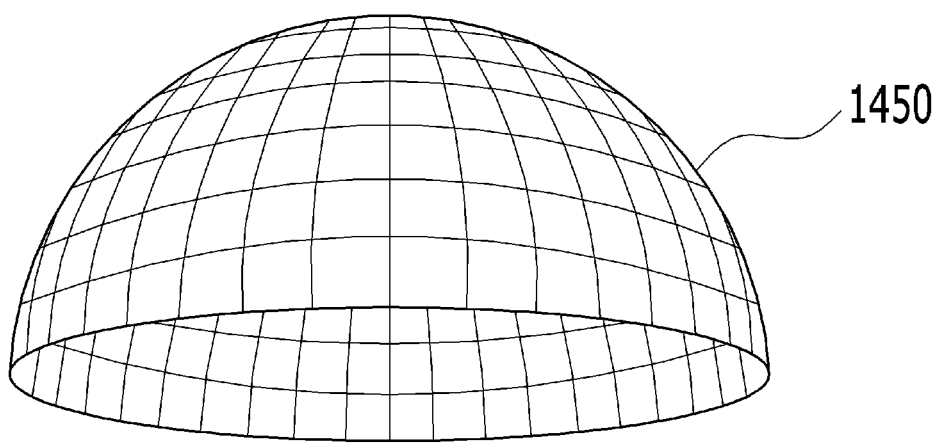
FIG. 8A is a perspective view showing a cap electrode pattern of a light emitting display device according to another aspect of the present disclosure.
Figure 8B:
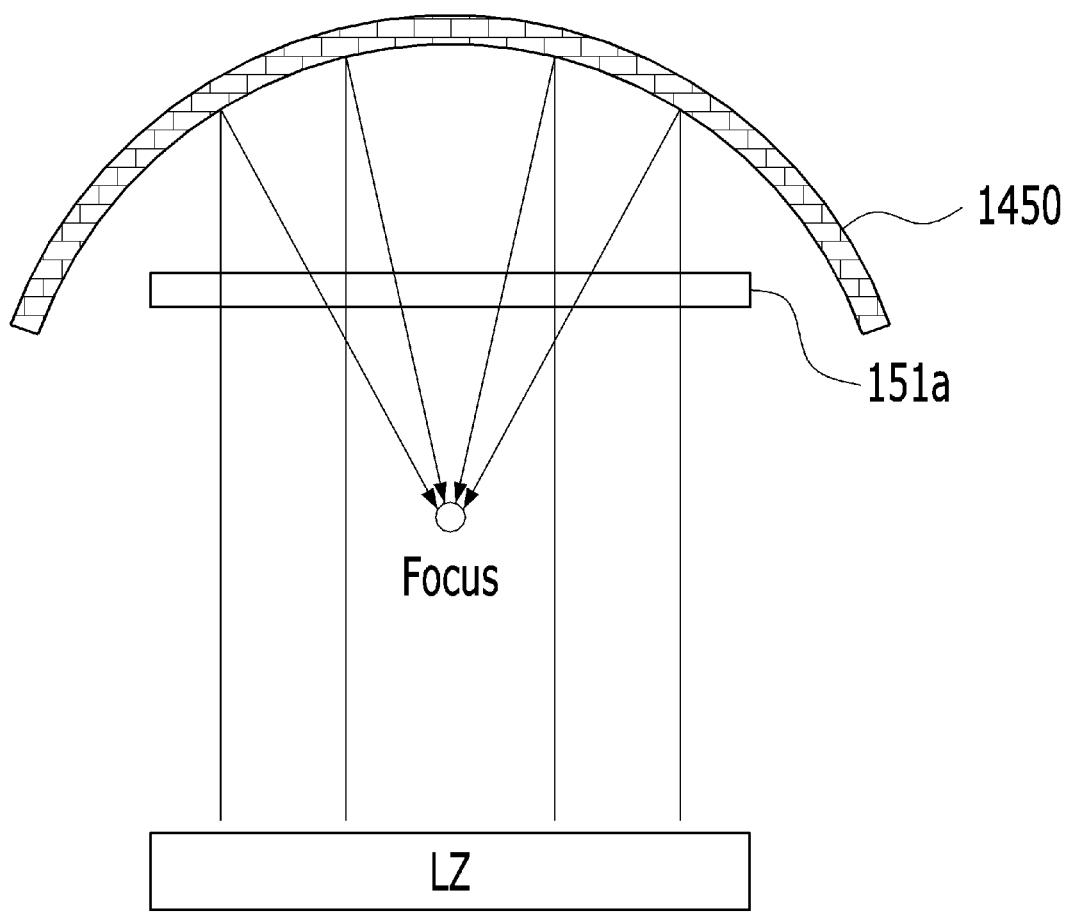
FIG. 8B is a diagram showing an energy concentration region when the cap electrode pattern of the light emitting display device according to another aspect of the present disclosure is applied.

FIG. 8A is a perspective view showing a cap electrode pattern of a light emitting display device according to another aspect of the present disclosure and FIG. 8B is a diagram showing an energy concentration region when the cap electrode pattern of the light emitting display device according to another aspect of the present disclosure is applied.

As shown in FIGS. 8A and 8B, the light emitting display device according to another aspect of the present disclosure may include only a cap electrode pattern 1450 without a lens.

In this case, the cap electrode pattern 1450 is made of a reflective metal or a reflective metal alloy to reflect straight incident light, and thus the light has a focus at a predetermined height in the planarization layer (reference numeral 137 shown in FIG. 2) disposed under the anode extension part 151a due to the curved shape of the cap electrode pattern. Here, under the planarization layer 137, the interlayer insulating film 133 and the passivation film 135 are provided on the substrate 100 as shown in FIG. 2.

Since the focus is at a predetermined height in the planarization layer 137, the light reflected from the cap electrode pattern 1450 can pass through the entire anode extension part 151a having a predetermined width corresponding to the laser irradiation region LRP without being focused on a local point of the anode extension part 151a. Therefore, in the light emitting display device according to the aspect of the present disclosure shown in FIGS. 8A and 8B, it is possible to prevent light radiated from a laser LZ from concentrating on a specific point, thereby achieving normal electrical separation between the anode 151 and the anode extension part 151a.

Although FIGS. 8A and 8B show that the cap electrode pattern 1450 has a single curved portion, the present disclosure is not limited thereto. As shown in FIGS. 2 to 4, the cap electrode pattern 1450 may have a plurality of curved portions to improve reflection efficiency on the inner surface of the cap electrode pattern 1450. When the cap electrode pattern 1450 is made of a reflective metal or a reflective metal alloy, the effect of preventing the cathode 153 from being damage may be obtained by eliminating or significantly reducing the amount of transmitted light. Further, in the light emitting display device according to the aspect of the present disclosure shown in FIGS. 8A and 8B, both straight light and refracted light pass through the anode extension part 151a, and thus laser light is concentrated.

The example in which the cap electrode pattern 1450 of FIGS. 8A to 8B is provided corresponds to a third experimental example Ex3 which will be described later.

Hereinafter, the effects of the light emitting display device of the present disclosure will be described with reference to the first to fourth experimental examples Ex1, Ex2, Ex3, and Ex4 in FIGS. 9A to 9D.

FIGS. 9A to 9D are plan views showing laser irradiation regions in the first to fourth experimental Examples Ex1 to Ex4.

The first to fourth experimental examples Ex1, Ex2, Ex3, and Ex4 respectively have a structure without a lens and a cap electrode pattern, a structure having only the lens 136, a structure having only the cap electrode pattern 145, and a structure having both the lens 136 and the cap electrode pattern 145 in the same laser irradiation region LRP.

Figure 9A:
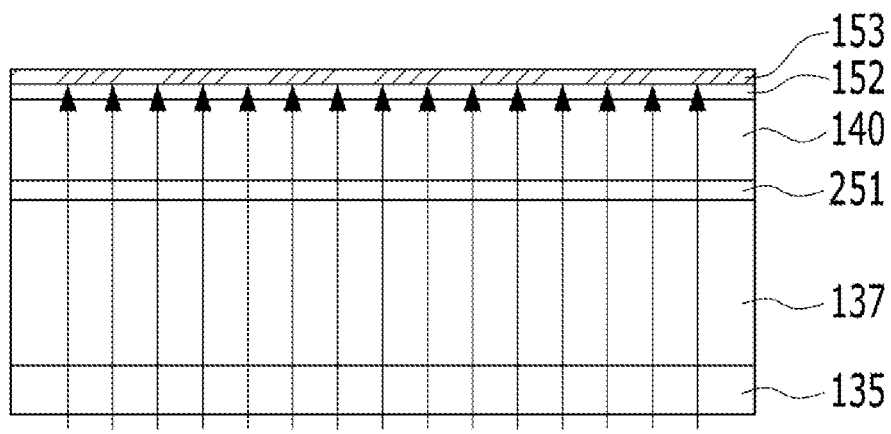
FIGS. 9A to 9D are plan views showing laser irradiation regions of first to fourth experimental examples.

FIG. 9A shows the structure of the first experimental example Ex1, in which the planarization layer 137, the anode extension part 251, the bank 140, the organic layer 152, and the cathode 153 are sequentially formed on the passivation film 135, which corresponds to the structure shown in FIG. 6A.

Figure 9B:
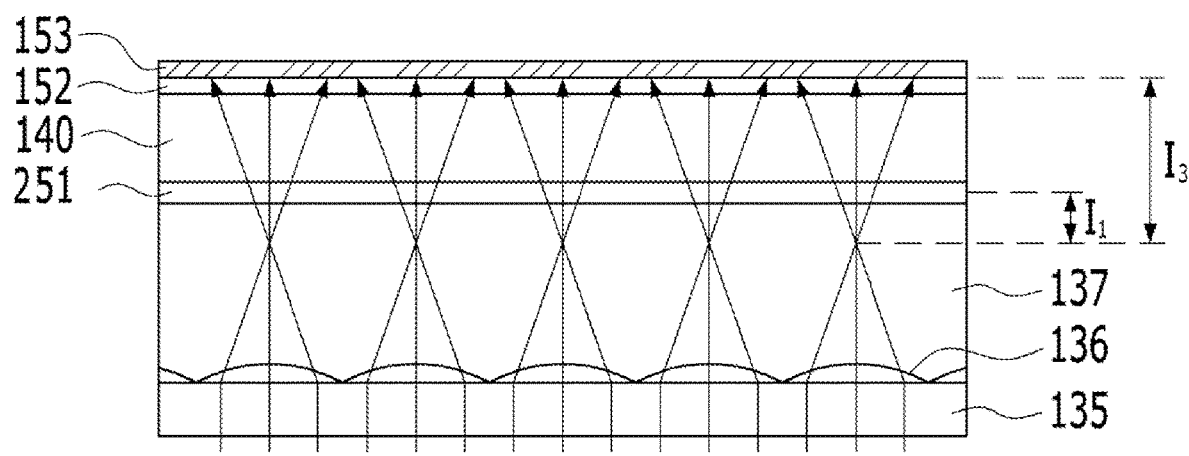

FIG. 9B is the structure of the second experimental example Ex2, which differs from the structure of the first experimental example Ex1 in that the lens 136 is further provided on the passivation film 135.

Figure 9C:
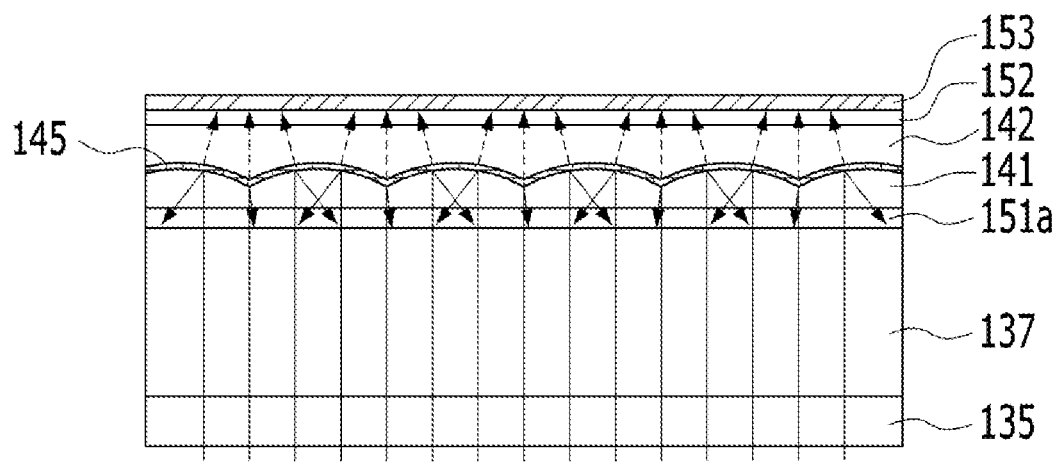

FIG. 9C shows the structure of the third experimental example Ex3, which differs from the structure of the first experimental example Ex1 in that a bank layer is divided into the first bank 141 and the second bank 142, the first bank 141 has curved portions, and the cap electrode pattern 145 is provided on the curved portions.

Figure 9D:
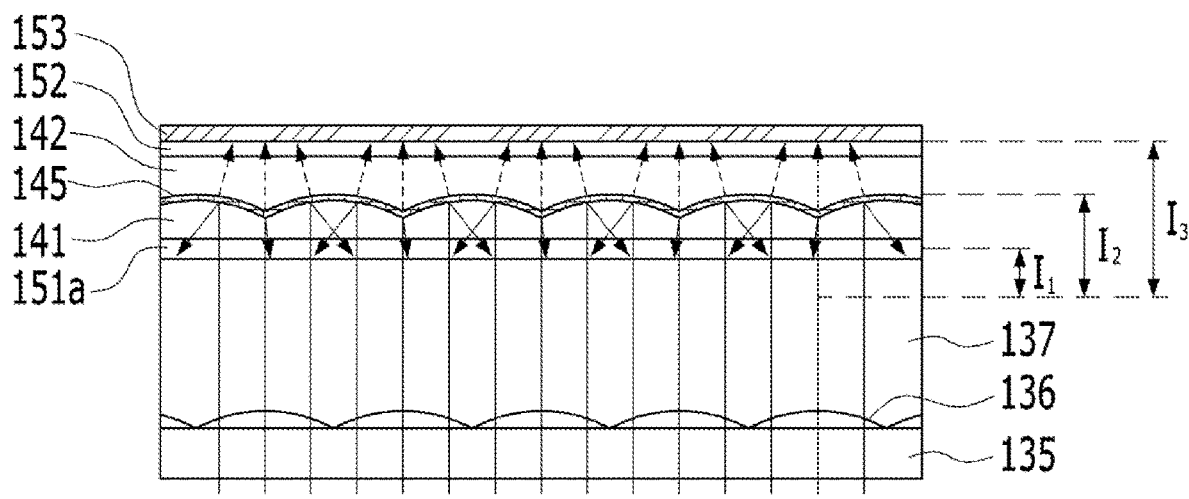

FIG. 9D shows the structure of the fourth experimental example Ex4 and relates to the light emitting display device according to the aspect of the present disclosure described with reference to FIGS. 1 to 3. In this structure, the lens 136 is provided on the passivation film 135 below the anode extension part 151a, and as in the third experimental example Ex3, the bank layer is divided into the first bank 141 and the second bank 142 on the anode extension part 151a, the first bank 141 has curved portions, and the cap electrode pattern 145 is formed on the curved portions.

TABLE 1

| | Amount of energy in anode extension part | Amount of energy in cap electrode pattern | Amount of energy in cathode |
|---|---|---|---|
| First experimental example | 1 | — | 1 |
| Second experimental example | $1/I_1^2$ | — | $1/I_3^2$ |
| Third experimental example | 2 | 1 | <1 |
| Fourth experimental example | $2/I_1^2$ | $1/I_2^2$ | $<1/I_3^2$ |

As shown in Table 1 and FIG. 9A, if the amount of light transmitted to the anode extension part 251 in the first experimental example Ex1 is 1, when straight laser light passes through the anode extension part 251, the bank 150, the organic layer 152, and the cathode 153, an amount of light similar to the amount of light transmitted to the anode extension part 251 is transmitted to the cathode 153 due to the property of the transparent anode extension part 251.

As shown in Table 1 and FIG. 9B, the second experimental example Ex2 is an example in which the lens 136 is further provided. As shown in FIG. 9B, when the planarization layer 137 has a focus, the anode extension part 251 having a first distance I1 from the focus and the cathode 153 having a third distance I3 from the focus receive the amounts of light in inverse proportion to the squares of the distances. That is, the anode extension part 251 receives an amount of light corresponding to 1/I12, and the cathode 153 receives an amount of light corresponding to 1/I32. Since the amount of light reaching the cathode 153 is relatively reduced, damage to the cathode 153 can be reduced in the case of the second experimental example Ex2.

As shown in Table 1 and FIG. 9C, in the third experimental example Ex3, the first bank 141 has curved portions on the surface and the cap electrode pattern 145 is further provided on the curved portions of the first bank 141. Compared to the first experimental example Ex1, light passes through the anode extension part 151a twice due to reflection by the cap electrode pattern 145 in the third experimental example Ex3. If the amount of light transmitted to the anode extension part 151a is 1 in the first experimental example Ex1, the amount of light transmitted to the anode extension part 151a becomes 2 in the third experimental example Ex3. In the third experimental example Ex3, the cap electrode pattern 145 has little transmittance of 10% or less due to its reflectivity, and thus reflects most of incident light. The amount of light transmitted to the cap electrode pattern 145 is similar to 1, which is the amount of light transmitted to the anode extension part 251 in the first experimental example Ex1. In addition, since the cap electrode pattern 145 reflects most of light in the third experimental example Ex3, the amount of light reaching the cathode 153 is less than the amount of light transmitted to the cap electrode pattern 145. In this case, the amount of light transmitted to the anode extension part 151a increases, and thus the intensity of laser radiation energy required for repair can be reduced.

In the fourth experimental example Ex4, a focus is generated in the planarization layer 137 according to the lens 136, and the anode extension part 151a, the cap electrode pattern 145, and the cathode 153 are spaced apart from the focus by a first distance I1, a second distance I2, and a third distance I3, respectively. The anode extension part 151a at the first distance I1 from the focus and the cathode 153 at the third distance I3 from the focus receive the amounts of light in inverse proportion to the squares of the distances. However, since the cap electrode pattern 145 primarily blocks most of light transmitted to the cathode 153 according to the reflectivity thereof, the cathode 153 receives an amount of light less than 1/I32. The anode extension part 151a receives a considerable amount of light corresponding to 2/I12 because straight laser light and reflected light pass through the anode extension part 151a. Accordingly, the anode extension part 151a of the laser irradiation region LRP may be destroyed even with small energy. Since the amount of light reaching the cathode 153 is relatively reduced, the anode extension part 151a can be destroyed with little damage to the cathode 153 in the fourth experimental example Ex4 as compared to the first to third experimental examples Ex1 to Ex3.

The light emitting display device of the present disclosure shown in FIGS. 1 to 3 corresponds to the fourth experimental example Ex4, and it can be ascertained that the anode extension part 151a can be appropriately separated during laser radiation.

In addition, as in the third experimental example Ex3 corresponding to FIGS. 8A, 8B and 9C, the anode extension part 151a can also be appropriately separated during laser light radiation due to the double light transmission effect of the anode extension part 151a in the light emitting display device according to another aspect of the present disclosure.

Further, in the light emitting display device of the present disclosure, the cap electrode pattern on the anode blocks light directed upwards or prevents damage to the cathode in which the light is dispersed and thus energy is concentrated on a local region even though the light is partially transmitted. By preventing the cathode from being damaged, the reliability of the light emitting display device can be improved.

To this end, a light emitting display device according to an aspect of the present disclosure may include a substrate including a plurality of sub-pixels, each sub-pixel having an emission part and a non-emission part, a lens at a part of the non-emission part on the substrate, a planarization layer covering the lens and provided on the plurality of sub-pixels, an anode overlapping with the emission part and the lens at each of the sub-pixels, on the planarization layer, a cap electrode pattern provided on the anode and overlapping with the lens, and an organic layer and a cathode sequentially disposed on the anode.

The light emitting display device may further include a first bank between the anode and the cap electrode pattern, and a second bank between the cap electrode pattern and the cathode.

The cap electrode pattern may have one or more curved portions.

The curved portions may be provided opposite to the upper surface of the first bank, and the upper surface of the first bank may have curved portions corresponding to the curved portions of the cap electrode pattern.

The first and second banks may be in contact with each other at the non-emission part at which the cap electrode pattern is not provided.

An interface between the first and second banks in contact with each other may be flat.

The cap electrode pattern may be made of a reflective metal or a reflective metal alloy.

The non-emission part may include a sub-pixel driving circuit, a passivation film for protecting the sub-pixel driving circuit may be provided on the substrate, and the lens may be provided on the passivation film of the non-emission part.

The lens may have a plurality of hemispherical surfaces or a plurality of arc surfaces on the upper surface of the passivation film, and focuses of the hemispherical surfaces or the arc surfaces may be in the planarization layer. And the lens may have the same focal distances in the planarization layer.

The cap electrode pattern may have a thickness of 1 nm to 300 nm.

A light emitting display device according to another aspect of the present disclosure may include a substrate including a plurality of sub-pixels, each sub-pixel having an emission part and a non-emission part, a planarization layer on the plurality of sub-pixels, an anode on the planarization layer at each of the sub-pixels, a cap electrode pattern on the anode and an organic layer and a cathode sequentially on the anode.

A light emitting display device according to another aspect of the present disclosure may include a substrate including a plurality of sub-pixels, each sub-pixel having an emission part and a non-emission part, a lens at a part of the non-emission part on the substrate, a planarization layer covering the lens and provided on the plurality of sub-pixels, an anode overlapping with the emission part and the lens at each of the sub-pixels, on the planarization layer and an organic layer and a cathode sequentially disposed on the anode.

The present disclosure described above is not limited to the above-described aspects and the accompanying drawings, and those skilled in the art will appreciate that various substitutions, modifications and variations can be made in the present disclosure without departing from the spirit or scope of the disclosure.

The light emitting display device of the present disclosure has the following effects.

The light emitting display device of the present disclosure further includes a lens and a cap electrode pattern on the lower and upper surfaces of an anode to which laser light is radiated during repair such that the laser light doubly converges on the anode, and thus the laser light can be concentrated on the anode even if the anode is transparent. Accordingly, repair can be normally performed.

In addition, in the light emitting display device of the present disclosure, the cap electrode pattern on the anode blocks light directed upwards or prevents the cathode from being damaged by energy concentration on a local region by dispersing the light even if some of the light pass through the cap electrode pattern. By preventing the cathode from being damaged, the reliability of the light emitting display device can be improved.

While the aspects of the present disclosure have been described with reference to the accompanying drawings, the present disclosure is not limited to the aspects and may be embodied in various different forms, and those skilled in the art will appreciate that the present disclosure may be embodied in specific forms other than those set forth herein without departing from the technical idea and essential characteristics of the present disclosure. The disclosed aspects are therefore to be construed in all aspects as illustrative and not restrictive.

What is claimed is:

1. A light emitting display device comprising
a substrate including a plurality of sub-pixels, each of the plurality of sub-pixels having an emission part and a non-emission part;
a lens disposed at a part of the non-emission part of the substrate;
a planarization layer covering the lens and provided on the plurality of sub-pixels;
an anode overlapping with the emission part and the lens at each of the plurality of sub-pixels, on the planarization layer;
a cap electrode pattern provided on the anode and overlapping with the lens; and
an organic layer and a cathode sequentially disposed on the anode.

2. The light emitting display device of claim 1, further comprising:
a first bank disposed between the anode and the cap electrode pattern; and
a second bank disposed between the cap electrode pattern and the cathode.

3. The light emitting display device of claim 2, wherein the cap electrode pattern has one or more curved portions.

4. The light emitting display device of claim 3, wherein the curved portions are provided opposite to the upper surface of the first bank, and the upper surface of the first bank has curved portions corresponding to the curved portions of the cap electrode pattern.

5. The light emitting display device of claim 2, wherein the first and second banks are in contact with each other at the non-emission part at which the cap electrode pattern is not provided.

6. The light emitting display device of claim 5, wherein an interface between the first and second banks in contact with each other is flat.

7. The light emitting display device of claim 1, wherein the cap electrode pattern is made of a reflective metal or a reflective metal alloy.

8. The light emitting display device of claim 1, wherein the non-emission part includes a sub-pixel driving circuit, a passivation film for protecting the sub-pixel driving circuit is provided on the substrate, and
wherein the lens is provided on the passivation film of the non-emission part.

9. The light emitting display device of claim 8, wherein the lens has a plurality of hemispherical surfaces or a plurality of arc surfaces on the upper surface of the passivation film, and focuses of the hemispherical surfaces or the arc surfaces are in the planarization layer.

10. The light emitting display device of claim 1, wherein the cap electrode pattern has a thickness of 1 nm to 300 nm.

11. A light emitting display device comprising:
a substrate including a plurality of sub-pixels, each of the plurality of sub-pixels having an emission part and a non-emission part;
a planarization layer disposed on the plurality of sub-pixels;
an anode disposed on the planarization layer at each of plurality of sub-pixels;
a cap electrode pattern disposed on the anode; and
an organic layer and a cathode sequentially disposed on the anode,
wherein the cap electrode pattern is provided in a bank superposed on the anode in the non-emission part.

12. The light emitting display device of claim 11, wherein the cap electrode pattern has a thickness of 1 nm to 300 nm.

13. A light emitting display device comprising:
- a substrate including a plurality of sub-pixels, each of the plurality of sub-pixels having an emission part and a non-emission part;
- a lens disposed at a part of the non-emission part on the substrate;
- a planarization layer covering the lens and provided on the plurality of sub-pixels;
- an anode overlapping with the emission part and the lens at each of the plurality of sub-pixels, on the planarization layer; and
- an organic layer and a cathode sequentially disposed on the anode.

14. The light emitting display device of claim 13, wherein the non-emission part includes a sub-pixel driving circuit, a passivation film for protecting the sub-pixel driving circuit is provided on the substrate, and
- wherein the lens is provided on the passivation film of the non-emission part.

15. The light emitting display device of claim 14, wherein the lens has a plurality of hemispherical surfaces or a plurality of arc surfaces on an upper surface of the passivation film, and focuses of the hemispherical surfaces or the arc surfaces are in the planarization layer.

* * * * *